(12) United States Patent
Sokol et al.

(10) Patent No.: US 11,613,814 B2
(45) Date of Patent: Mar. 28, 2023

(54) SACRIFICIAL ANODES FOR USE IN METERS

(71) Applicant: Sensus Spectrum, LLC, Morrisville, NC (US)

(72) Inventors: Benjamin John Sokol, Carrboro, NC (US); Michael David Brazeau, Raleigh, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 298 days.

(21) Appl. No.: 16/151,501

(22) Filed: Oct. 4, 2018

(65) Prior Publication Data

US 2020/0109477 A1    Apr. 9, 2020

(51) Int. Cl.
| | | |
|---|---|---|
| *C23F 13/16* | (2006.01) | |
| *G06Q 50/06* | (2012.01) | |
| *G01F 25/10* | (2022.01) | |

(52) U.S. Cl.
CPC .............. *C23F 13/16* (2013.01); *G01F 25/15* (2022.01); *G06Q 50/06* (2013.01)

(58) Field of Classification Search
CPC .......... C23F 13/02; C23F 13/06; C23F 13/08; C23F 13/10; C23F 13/16; C23F 2213/30; C23F 13/00; G01F 3/22–3/228; G01F 25/0053; G06Q 50/06
See application file for complete search history.

(56) References Cited

U.S. PATENT DOCUMENTS

| | | | |
|---|---|---|---|
| 5,594,167 A * | 1/1997 | Ward | G01F 3/222 |
| | | | 73/274 |
| 6,025,578 A | 2/2000 | Bruck et al. | |
| 6,218,840 B1 * | 4/2001 | Warren | H02G 9/02 |
| | | | 324/326 |
| 9,988,132 B1 | 6/2018 | Roberts | |
| 2010/0140082 A1 | 6/2010 | Petrosino | |
| 2010/0289667 A1 * | 11/2010 | Turgeon | G08C 17/02 |
| | | | 340/12.5 |
| 2011/0014825 A1 | 1/2011 | Drew et al. | |
| 2012/0006948 A1 | 1/2012 | Hiss et al. | |
| 2014/0193222 A1 * | 7/2014 | Egele | F16B 25/00 |
| | | | 411/411 |
| 2017/0321839 A1 * | 11/2017 | Doerr | C23F 13/18 |

FOREIGN PATENT DOCUMENTS

| | | |
|---|---|---|
| EP | 3 249 753 A1 | 11/2017 |
| JP | 2001 355774 A | 12/2001 |
| JP | 2001355774 A * | 12/2001 |

OTHER PUBLICATIONS

Google Patent translation of JP2001355774A (Year: 2020).*
Akhoondan et al ("Fastener Corrosion", Structure Magazine, 2016, pp. 74-75). (Year: 2016).*
International Search Report and Written Opinion, PCT/US2019/048477, dated Nov. 22, 2019, 11 pages.

* cited by examiner

*Primary Examiner* — Alexander W Keeling
(74) *Attorney, Agent, or Firm* — Stanek Lemon Crouse & Meeks, PA (57) ABSTRACT

A sacrificial anode for use with a meter is provided. The sacrificial anode comprising an anode body including one or more anodic metals, the anode body being configured to be positioned in a problem area of the meter including a cathodic metal, such that the anode body corrodes in place of the cathodic metal of the problem area preserving the cathodic metal. Related meters and systems are also provided.

5 Claims, 9 Drawing Sheets

SACRIFICIAL ANODES FOR USE IN METERS

FIELD

The present inventive concept relates generally to meters and, more particularly, to corrosion of metals on installed meters in the field.

BACKGROUND

Meters are generally installed on an exterior of a building to allow the meters to be accessed for such things as reading and maintenance. Being exposed to the elements twenty-four hours a day, seven days a week can cause the meter to physically deteriorate. Utilities/customers generally do not want to incur the cost of constantly replacing meters due to physical deterioration. One of the biggest problems is corrosion. Corrosion is an electrochemical reaction that occurs when an acidic substance, for example, water, comes in contact with metals, such as iron and/or steel. The result is generally rust. Predictably, the fastenings on a housing of the meter are subject to corrosion. In particular, corrosion of cast aluminum gas meter bodies is of large concern given an expected twenty-year field life of the meter. For example, areas on the meter body that are often subject to corrosion are areas near screws of dissimilar metals. Conventional methods using coatings and paint to protect these areas of concern have proven to be an inadequate in dealing with the galvanic corrosion.

SUMMARY

Some embodiments of the present inventive concept provide a sacrificial anode for use with a meter, the sacrificial anode comprising an anode body including one or more anodic metals, the anode body being configured to be positioned in a problem area of the meter including a cathodic metal, such that the anode body corrodes in place of the cathodic metal of the problem area preserving the cathodic metal.

In further embodiments, the cathodic metal may be aluminum.

In still further embodiments, the one or more anodic metals may be one or more of zinc and magnesium.

In some embodiments, the problem area may be adjacent to an area having fastenings of dissimilar metals.

In further embodiments, the sacrificial anode may be configured to have a press fit structure with the problem area.

Still further embodiments of the present inventive concept provide a gas meter including a meter body; a printed circuit board attached to the meter body; a fastening coupling the printed circuit board to the meter body, the fastening comprising a first metal; and a sacrificial anode positioned adjacent the fastening, the sacrificial anode comprising a second metal, different from the first metal, the second metal configured to corrode faster than the first metal to preserve the first metal.

Some embodiments of the present inventive concept provide a system for reducing corrosion at problem areas in a meter. The system includes a fastening coupling elements to body of the meter, the fastening comprising a first metal; and a sacrificial anode positioned adjacent the fastening, the sacrificial anode comprising a second metal, different from the first metal, the second metal configured to corrode faster than the first metal to preserve the first metal.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover; when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific ter its) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed in the background, for meters installed outside a building, corrosion is a challenge and, if left untreated, could cause a significant decrease in the life of the meter. For example, corrosion of cast aluminum bodies which commonly form a pressure vessel of a gas meters (in North America) is often a design challenge. Coatings and paints are commonly used to mitigate corrosion, but they are susceptible to scratching and incorrect application and, thus, are typically inadequate.

One type of corrosion that commonly occurs in these meters is galvanic corrosion (or bimetallic corrosion). Galvanic corrosion is an electrochemical process in which one metal corrodes preferentially when it is in electrical contact with another, in the presence of an electrolyte, for example, acids, bases and salts. Conventional methods of coating these metals with paint or the like to avoid the "contact" have not be successful. Accordingly, some embodiments of the present inventive concept utilize sacrificial anodes in problem areas to mitigate corrosion. In particular, since the meters are generally made of more cathodic metals, for example, aluminum, the sacrificial anodes are made of a more anodic metals, for example, Zinc or Magnesium. The anodic metals corrode easier than (or in place of) the cathodic metal (aluminum). Thus, by placing sacrificial anodes near likely galvanic couples (problem areas), the aluminum may be preserved as will be discussed further herein with respect to FIGS. 1 through 10.

As used herein, a "problem area" refers to any area that may be subject to corrosion and could benefit from a sacrificial anode as discussed herein. Although embodiments of the present inventive concept are discussed herein with respect to galvanic corrosion with respect to a meter, specifically gas meters with aluminum cast bodies, embodiments of the present inventive concept are not limited thereto. For example, embodiments of the present inventive concept may be useful in maintaining the integrity of a pressure vessel and/or reducing galvanic corrosion of a printed circuit grounding pathway without departing from the scope of the present inventive concept.

Furthermore, although metals such as zinc and magnesium are discussed herein as materials for the sacrificial anode, embodiments of the present inventive concept are not limited to this configuration. As used herein, a sacrificial anode refers to a highly active metal used to reduce the likelihood of a less active material surface from corroding. In accordance with embodiments discussed herein, sacrificial anodes may be created from a metal/metal alloy with a more negative electrochemical potential than the other metal it will be used to protect.

Figure 1:
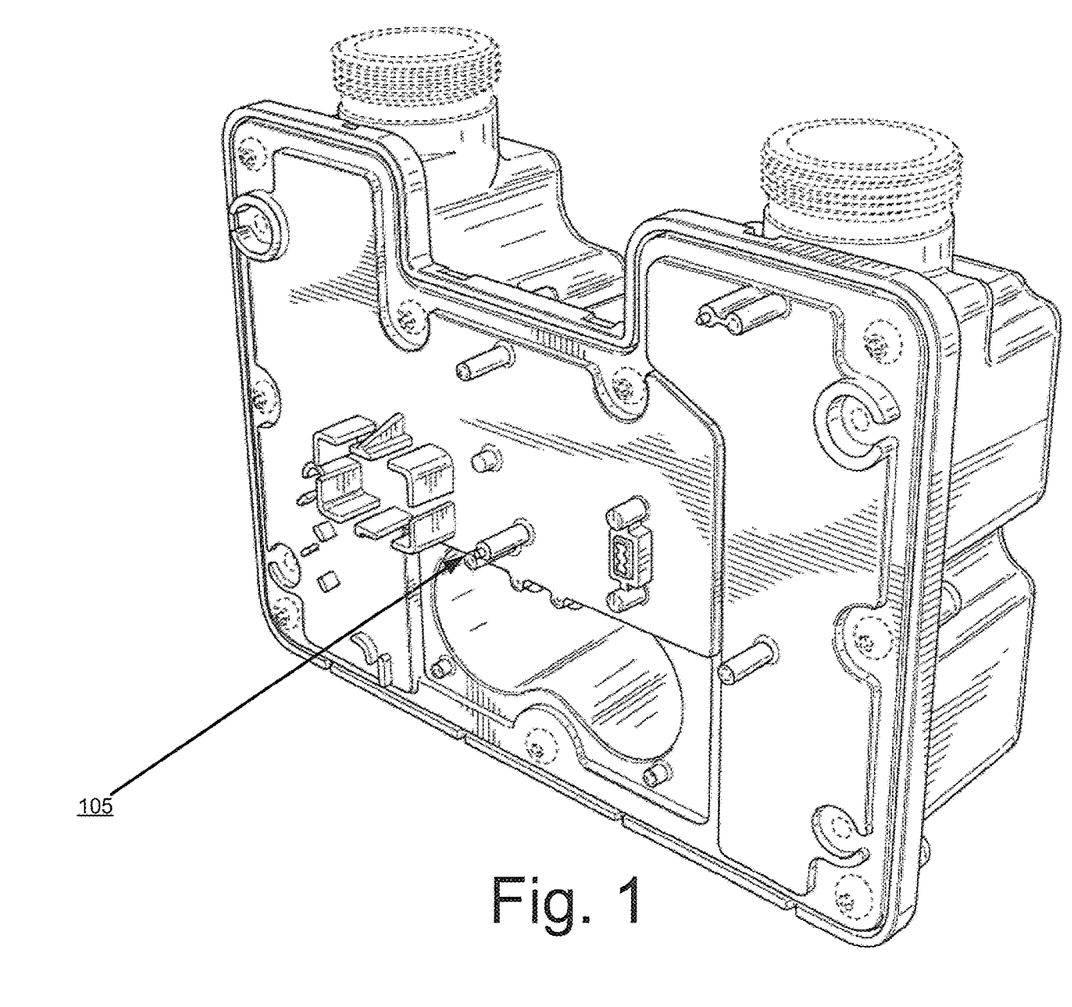
FIG. 1 is a diagram of a gas meter including a problem area/region in accordance with some embodiments of the present inventive concept.
Figure 2:
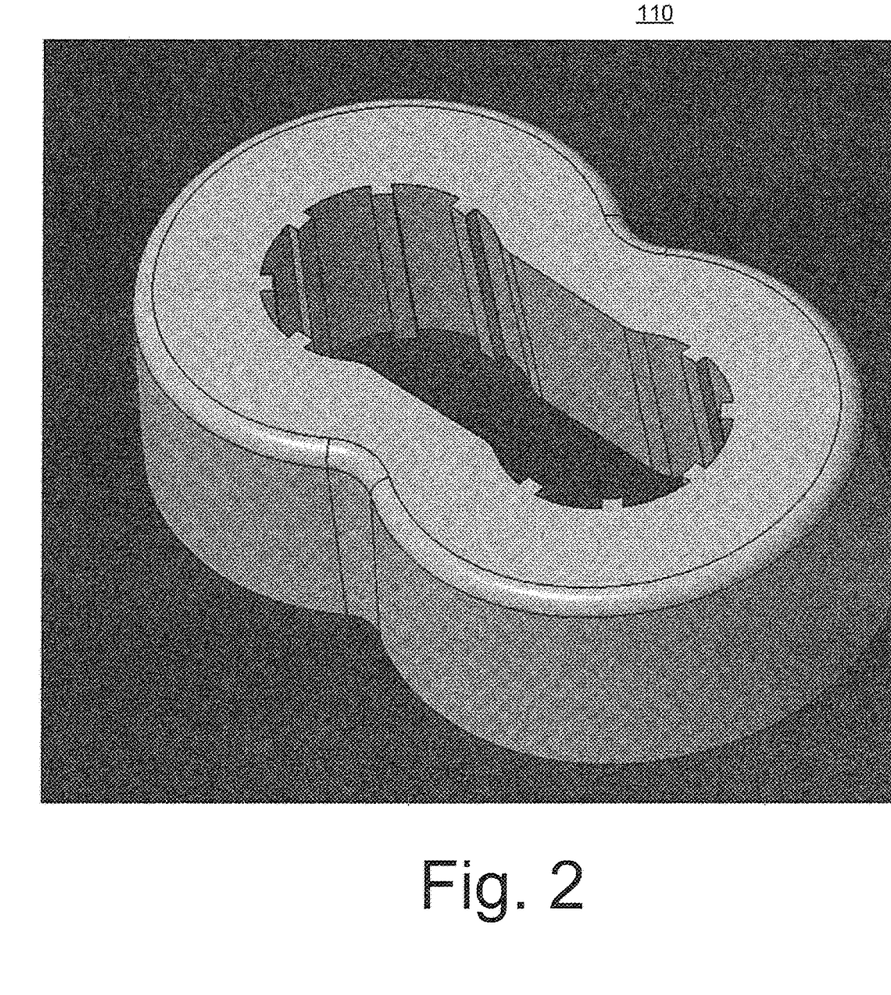
FIG. 2 is a perspective view of a sacrificial anode in accordance with some embodiments of the present inventive concept.
Figure 3:
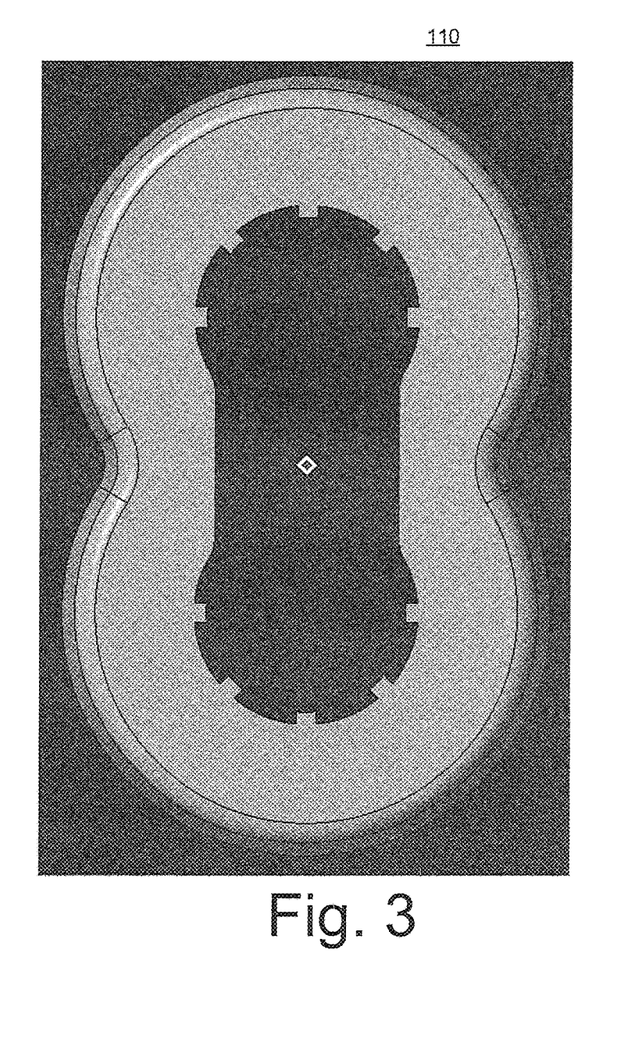
FIG. 3 is a top view of a sacrificial anode in accordance with some embodiments of the present inventive concept.
Figure 4:
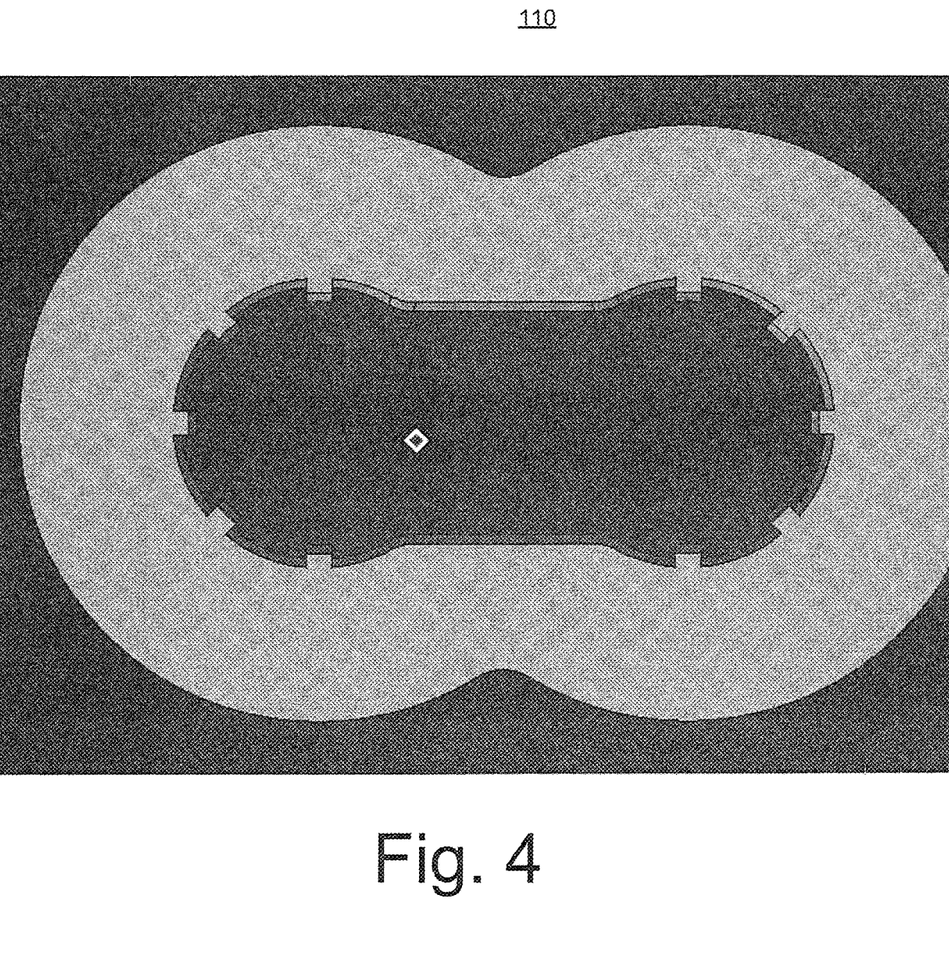
FIG. 4 is a bottom view of a sacrificial anode in accordance with some embodiments of the present inventive concept.
Figure 5:
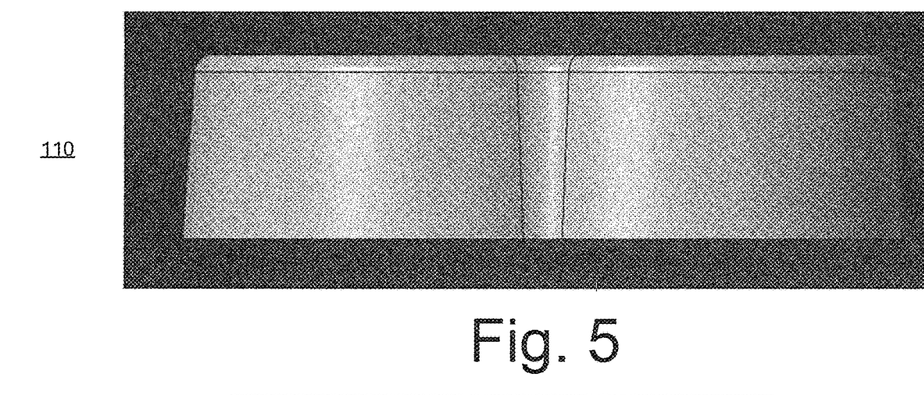
FIG. 5 is a side view of a sacrificial anode in accordance with some embodiments of the present inventive concept.

Referring to FIG. 1, a diagram of a gas meter without a faceplate and printed circuit board attached will be discussed. Areas of a meter body, for example, gas meter 100 of FIG. 1, that are susceptible to galvanic corrosion are often, for example, near screws of dissimilar metals 105 (problem area) of FIG. 1. To manage the corrosion in these areas, a sacrificial anode made of, for example, zinc or magnesium, may be positioned on or near these areas subject to corrosion, for example, area 105 of FIG. 1. In some embodiments, the sacrificial anode may have a press fit structure, i.e. a fit between two parts in which one is forced under pressure into a slightly smaller hole in the other.

Once positioned, the sacrificial anode is configured to, corrode instead of the aluminum body and would help preserve the viability of the meter 100. The connection between the sacrificial anode and the aluminum body would be conductive. Furthermore, the closer the sacrificial anode is to the problem area, for example, area 105, the better the protection the sacrificial anode can provide. Sacrificial anodes in accordance with embodiments discussed herein may be especially useful in a gas meters 100 having aluminum cast bodies and integral radio boards that relies on a consistent ground between the board and case, but are not limited thereto.

In particular, meters including radio boards may have gold on the board that is grounded to the aluminum case via, for example, a steel screw. The possibility for galvanic corrosion is therefore high in this area of the meter. Any corrosion in any part of this grounding pathway may lead to a ground resistance change, which would abrogate antenna performance. Thus, a sacrificial anode may be provided in this area of the meter to protect the ground path. Embodiments directed to this particular sacrificial anode will now be discussed with respect to FIGS. 2 through 10. However, it will be understood that sacrificial anodes in accordance with embodiments discussed herein may be used in other areas of a gas meter without departing from the present inventive concept.

Referring now to FIGS. 2 through 10, a sacrificial anode in a gas meter used to preserve a critical ground path will be discussed. FIGS. 2 through 5 illustrate a perspective view, a top view, a bottom view and a side view, respectively, of a sacrificial anode in accordance with some embodiments. The sacrificial anode 110 can include a highly active metal/ material used to reduce the likelihood of a less active material surface from corroding. For example, in some embodiments, the sacrificial anode may include zinc or magnesium.

Figure 6:
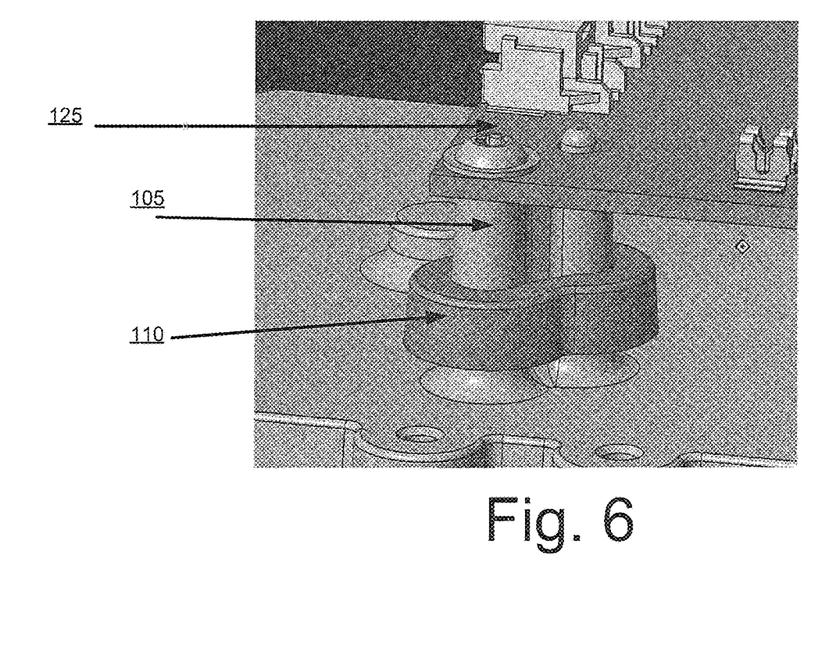
FIG. 6 is a diagram illustrating a perspective view of a sacrificial anode positioned in a problem area in accordance with some embodiments of the present inventive concept.
Figure 7:
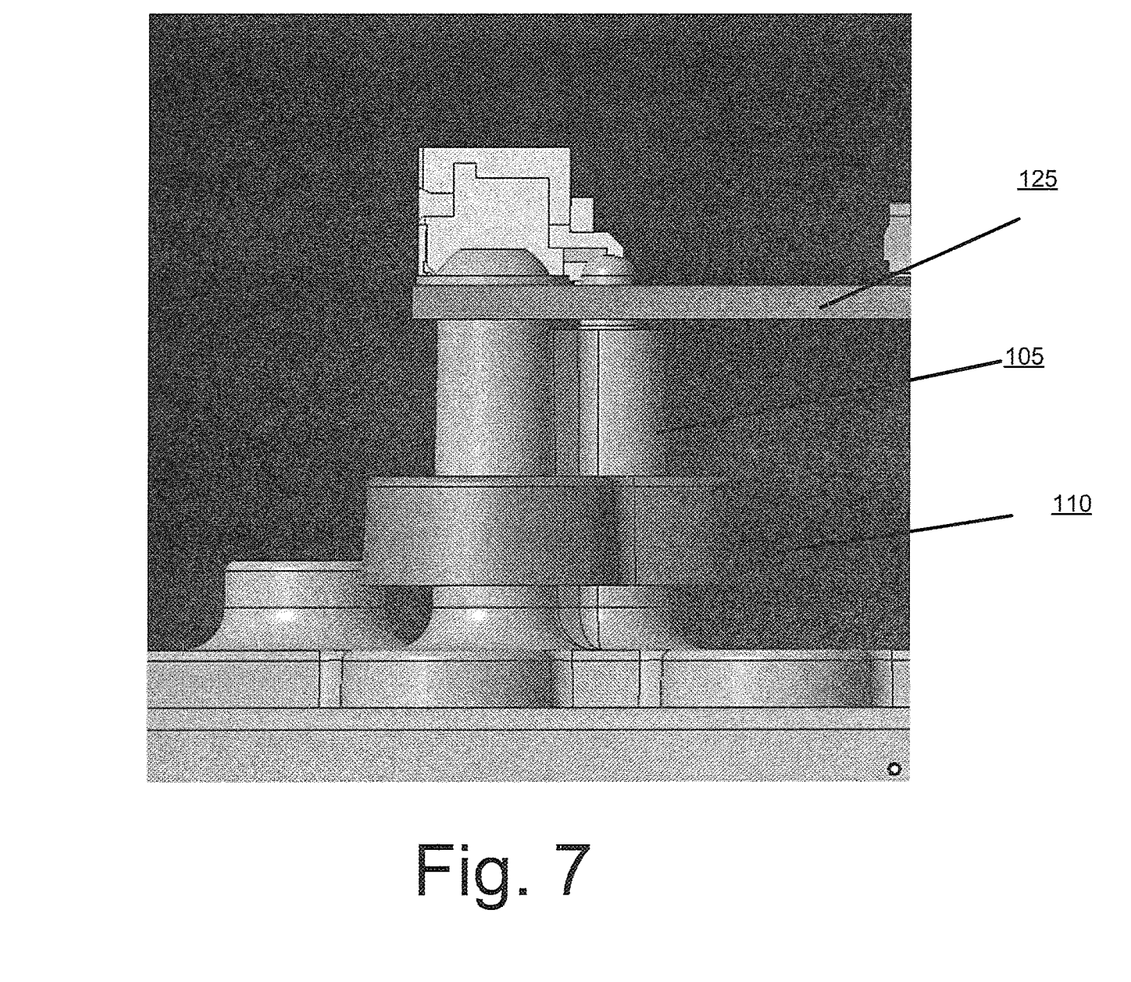
FIG. 7 is side view of the sacrificial anode positioned in a problem area in accordance with some embodiments of the present inventive concept.
Figure 8:
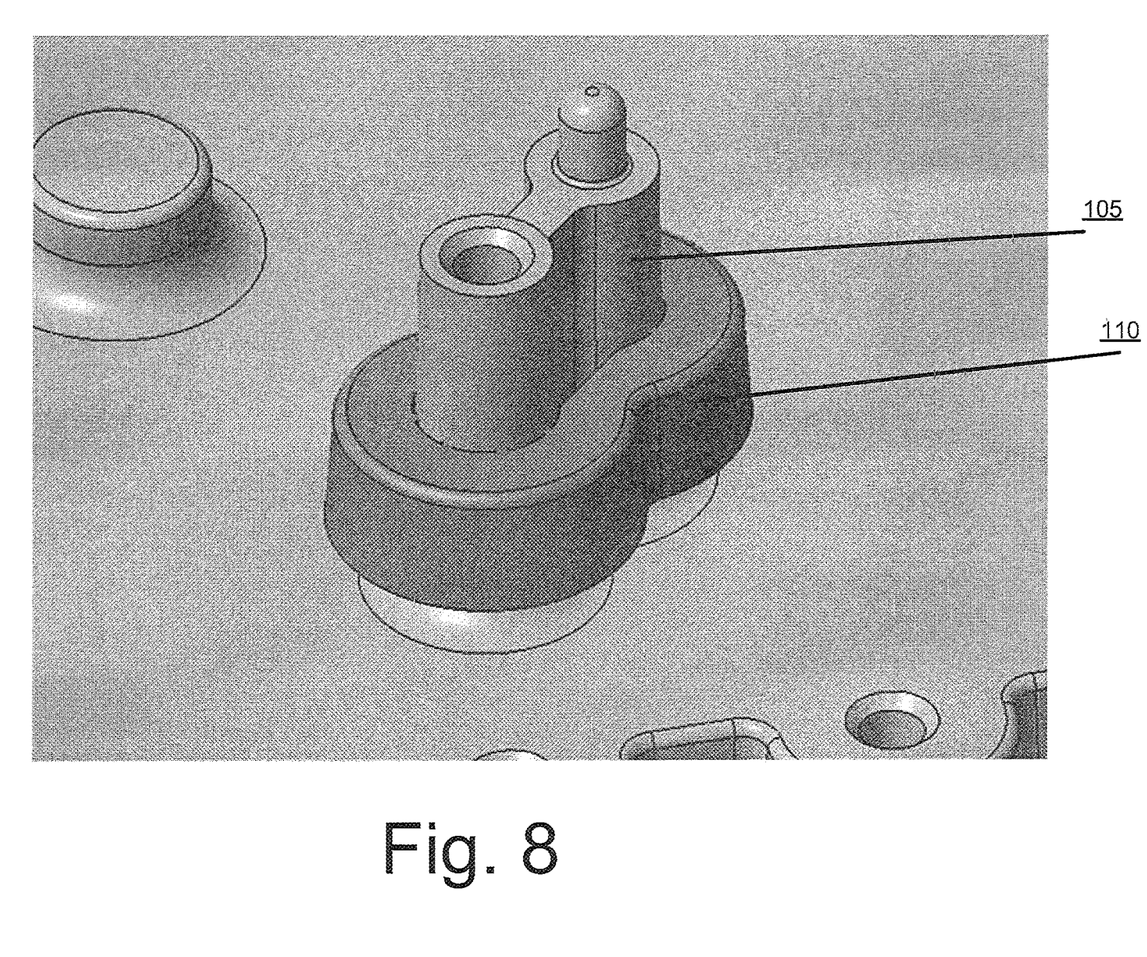
FIGS. 8 and 9 are a perspective view and bottom view of a sacrificial anode positioned in a problem area in accordance with some embodiments of the present inventive concept.
Figure 9:
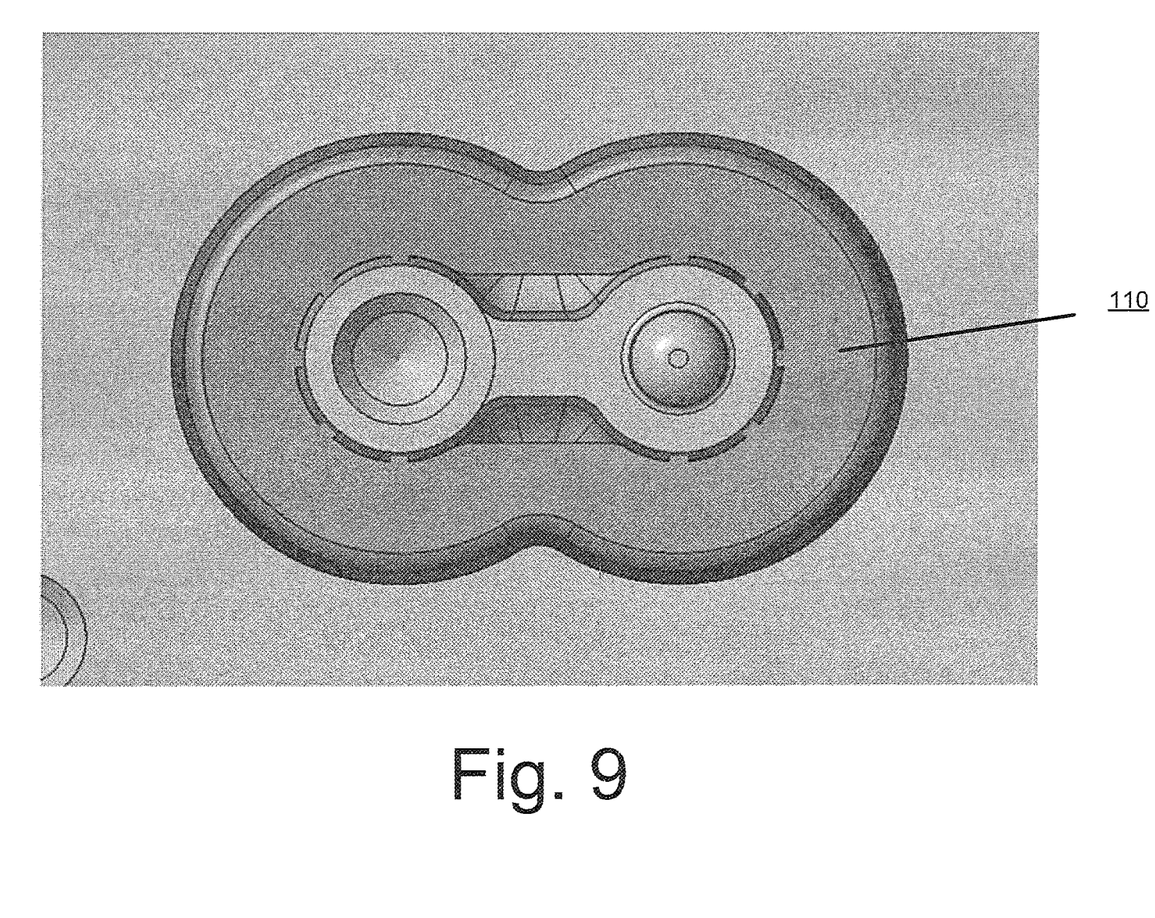
Figure 10:
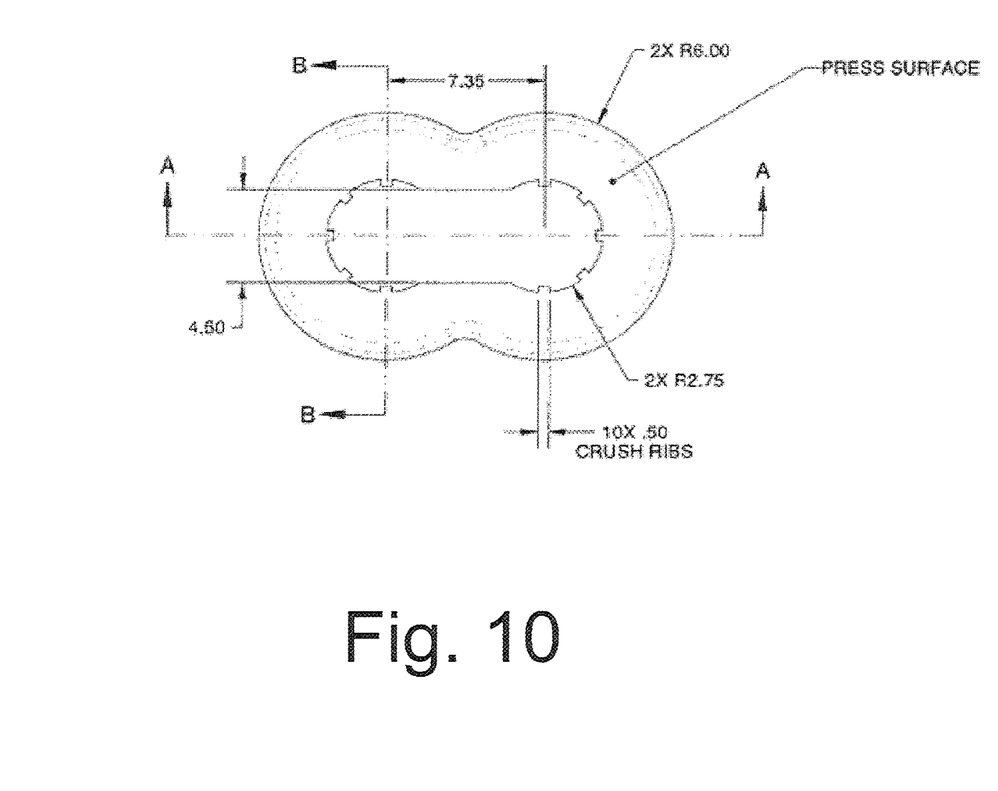
FIG. 10 is a diagram of a sacrificial anode having dimensions thereon in accordance with some embodiments of the present inventive concept.

As discussed above, the closer the sacrificial anode 110 is to the problem area, for example, area 105 (FIG. 1), the better the protection the sacrificial anode 110 can provide. Thus, the sacrificial anode 110 illustrated in FIGS. 2 through 5 is configured to be positioned around the base of the problem area 105 beneath the PCB 125 as shown in FIG. 6. FIG. 7 is a side view of the sacrificial anode 110 positioned on the problem area 105. As is clear from FIGS. 6 and 7, the sacrificial anode 110 is positioned as close to the problem area 110 as possible to provide the best result of inhibiting corrosion. FIGS. 8 and 9 provide a perspective and bottom view, respectively, of the sacrificial anode 110. FIG. 10 provides various dimensions of embodiments of the present inventive concept illustrated in FIGS. 2 through 9.

As briefly discussed above, meters that are stored in an exterior space are subject to rapid deterioration especially due to corrosion in problem areas. Thus, in some embodiments of the present inventive concept sacrificial anodes are used in problem areas to mitigate corrosion. In particular, since the meters are generally made of more cathodic metals, for example, aluminum, the sacrificial anodes are made of a more anodic metals, for example, Zinc or Magnesium. The anodic metals corrode easier than (or in place of) the cathodic metal (aluminum). Thus, by placing sacrificial anodes near likely galvanic couples (problem areas), the aluminum may be preserved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A gas meter comprising:
   a meter body;
   a printed circuit board attached to the meter body using a plurality of screws positioned between the printed circuit board and the meter body, wherein the plurality of screws comprise a first metal including a cathodic metal and fasten the printed circuit board to the meter body; and
   a press fit sacrificial anode press fit to surround the plurality of screws, the press fit sacrificial anode comprising a second metal, different from the first metal and including anodic metals that corrode faster than the cathodic metals of the plurality of screws to preserve the cathodic metal of the plurality of screws.

2. The meter of claim 1, wherein the cathodic metal is aluminum.

3. The meter of claim 1, wherein the one or more anodic metals is one or more of zinc and magnesium.

4. The meter of claim 1, wherein the plurality of screws define a problem area that is subject to corrosion on the gas meter and wherein the problem area is adjacent to an area having dissimilar metals.

5. The meter of claim 1, wherein the meter further comprises a radio board, wherein the radio board is positioned adjacent the press fit sacrificial anode.

* * * * *